US012690141B2

(12) United States Patent
Lu et al.

(10) Patent No.: US 12,690,141 B2
(45) Date of Patent: Jul. 21, 2026

(54) WIRING BOARD STRUCTURE

(71) Applicant: UNIMICRON TECHNOLOGY CORP., Taoyuan City (TW)

(72) Inventors: Wen-Hsien Lu, Taoyuan City (TW); Yu-Ling Chuang, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 190 days.

(21) Appl. No.: 18/601,514

(22) Filed: Mar. 11, 2024

(65) Prior Publication Data

US 2025/0267801 A1 Aug. 21, 2025

(30) Foreign Application Priority Data

Feb. 19, 2024 (TW) ................................. 113105841

(51) Int. Cl.
H05K 1/02 (2006.01)
H05K 3/46 (2006.01)

(52) U.S. Cl.
CPC ......... H05K 3/4682 (2013.01); H05K 1/0271 (2013.01); H05K 1/0298 (2013.01); H05K 3/4602 (2013.01); H05K 2201/0187 (2013.01)

(58) Field of Classification Search
CPC .. H05K 3/4682; H05K 1/0298; H05K 3/4602; H05K 3/4673; H05K 1/0271; H05K 2201/0187
See application file for complete search history.

(56) References Cited

U.S. PATENT DOCUMENTS

| | | | |
|---|---|---|---|
| 9,401,330 B1 * | 7/2016 | Jiang ................. | H01L 23/49822 |
| 11,596,066 B1 * | 2/2023 | Amla ........................ | C08J 5/043 |
| 2005/0178585 A1 * | 8/2005 | Kim ........................ | H05K 1/115 |
| | | | 174/262 |
| 2015/0245473 A1 * | 8/2015 | Shimizu ............... | H05K 1/0298 |
| | | | 29/850 |
| 2019/0174638 A1 * | 6/2019 | Silvano de Sousa ........................ | |
| | | | H05K 3/4608 |
| 2022/0169791 A1 * | 6/2022 | Sugawara .......... | C08G 73/1042 |
| 2022/0201836 A1 * | 6/2022 | S ............................ | H05K 1/0231 |
| 2023/0217589 A1 * | 7/2023 | Lorenzoni .............. | H05K 1/188 |
| | | | 174/251 |
| 2023/0235229 A1 * | 7/2023 | Eda ............................ | C08J 5/18 |
| | | | 174/251 |

* cited by examiner

*Primary Examiner* — Steven T Sawyer
(74) *Attorney, Agent, or Firm* — Birch, Stewart, Kolasch & Birch, LLP

(57) ABSTRACT

A wiring board structure is provided, which includes a substrate, a first build-up circuit layer, and a second build-up circuit layer. The first build-up circuit layer is disposed on a first side of the substrate and has a first wiring area, and the first wiring area includes a first metal and a first dielectric. The second build-up circuit layer is disposed on a second side of the substrate and has a second wiring area, and the second wiring area includes a second metal, a second dielectric, and a third dielectric. The total volume of the second metal is less than the total volume of the first metal. The material of the third dielectric is different from the material of the second dielectric, and the ratio of the total volume of the third dielectric to the total volume of the second dielectric is between 0.45 and 0.55.

20 Claims, 6 Drawing Sheets

WIRING BOARD STRUCTURE

CROSS REFERENCE TO RELATED APPLICATIONS

This application claims priority of Taiwan Patent Application No. 113105841, filed on Feb. 19, 2024, the entirety of which is incorporated by reference herein.

BACKGROUND OF THE INVENTION

Field of the Invention

The present disclosure relates to wiring board structures, and, in particular, to a wiring board structure used in high-frequency and high-speed wiring.

Description of the Related Art

In the manufacturing process of circuit boards, a substrate is usually used as a base, and build-up circuit layers are sequentially stacked on both sides of the substrate through a build-up process to form various circuit boards. In some special applications, the build-up circuit layers on both sides of the substrate may have an asymmetric structure. For example, under high-frequency and high-speed electrical requirements, the build-up circuit layer on one side of the substrate may have fewer wirings (for example, vertical connectors are provided but no horizontal connectors are provided in specific areas) to meet signal integrity and impedance control.

However, the asymmetric structure may cause some problems. For example, when the wiring volume (i.e., the total volume of metal conductors) in the build-up circuit layers on both sides of the substrate is too different, unexpected internal stresses may be generated during operation (e.g., thermal stress occurs at operating temperatures), causing the circuit board to warp. Therefore, although existing circuit boards have largely met their intended purposes, they do not meet requirements in all respects. Therefore, there is still a need to develop new wiring board structures.

BRIEF SUMMARY OF THE INVENTION

In some embodiments, a wiring board structure is provided. The wiring board structure includes a substrate, a first build-up circuit layer, and a second build-up circuit layer. The substrate has a first side and a second side opposite to each other. The first build-up circuit layer is disposed on the first side of the substrate, wherein the first build-up circuit layer has a first wiring area, and the first wiring area includes a first metal and a first dielectric. The second build-up circuit layer is disposed on the second side of the substrate, wherein the second build-up circuit layer has a second wiring area, and the second wiring area includes a second metal, a second dielectric, and a third dielectric. The total volume of the second metal is less than the total volume of the first metal. The material of the third dielectric is different from the material of the second dielectric, and the ratio of the total volume of the third dielectric to the total volume of the second dielectric is between 0.45 and 0.55.

In some embodiments, the first wiring area and the second wiring area correspond to each other, and the volume of the first wiring area is the same as the volume of the second wiring area.

In some embodiments, in a top view, the second wiring area has two opposite straight sides and two opposite arc sides.

In some embodiments, in the top view, the third dielectric surrounds the second metal and is in direct contact with the second metal.

In some embodiments, in the top view, the second dielectric is separated from the first metal by the third dielectric.

In some embodiments, in the top view, the third dielectric has a rectangular shape.

In some embodiments, in the top view, the second dielectric surrounds the third dielectric.

In some embodiments, in the top view, the third dielectric is separated from the second metal by the second dielectric.

In some embodiments, in the top view, the second dielectric has a rectangular shape.

In some embodiments, the third dielectric penetrates the second build-up circuit layer along a vertical direction.

In some embodiments, the Young's modulus of the third dielectric material is greater than 1000 MPa at 250° C.

In some embodiments, the Young's modulus of the third dielectric is between 1800 MPa and 2400 MPa at 250° C.

In some embodiments, the thermal expansion coefficient of the third dielectric is greater than 70 ppm/° C. at 250° C.

In some embodiments, the thermal expansion coefficient of the third dielectric is between 75 ppm/° C. and 95 ppm/° C. at 250° C.

In some embodiments, the material of the first dielectric is the same as the material of the second dielectric.

In some embodiments, the Young's modulus of the first dielectric and the second dielectric is between 100 MPa and 500 MPa at 250° C.

In some embodiments, the thermal expansion coefficients of the first dielectric and the second dielectric are between 40 ppm/° C. and 60 ppm/° C. at 250° C.

In some embodiments, the material of the first metal is the same as the material of the second metal.

In some embodiments, the second metal forms a plurality of vertical connectors, and the plurality of vertical connectors are electrically isolated from each other.

In some embodiments, the second build-up circuit layer further includes a horizontal connector, and the horizontal connector is located outside the second wiring area, wherein the plurality of vertical connectors in the second wiring area are electrically isolated from the horizontal connector.

The device of the present disclosure can be applied in a variety of electronic devices. In order to make the features and advantages of the present disclosure more comprehensible, various embodiments are specially cited hereinafter, together with the accompanying drawings, to be described in detail as follows.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
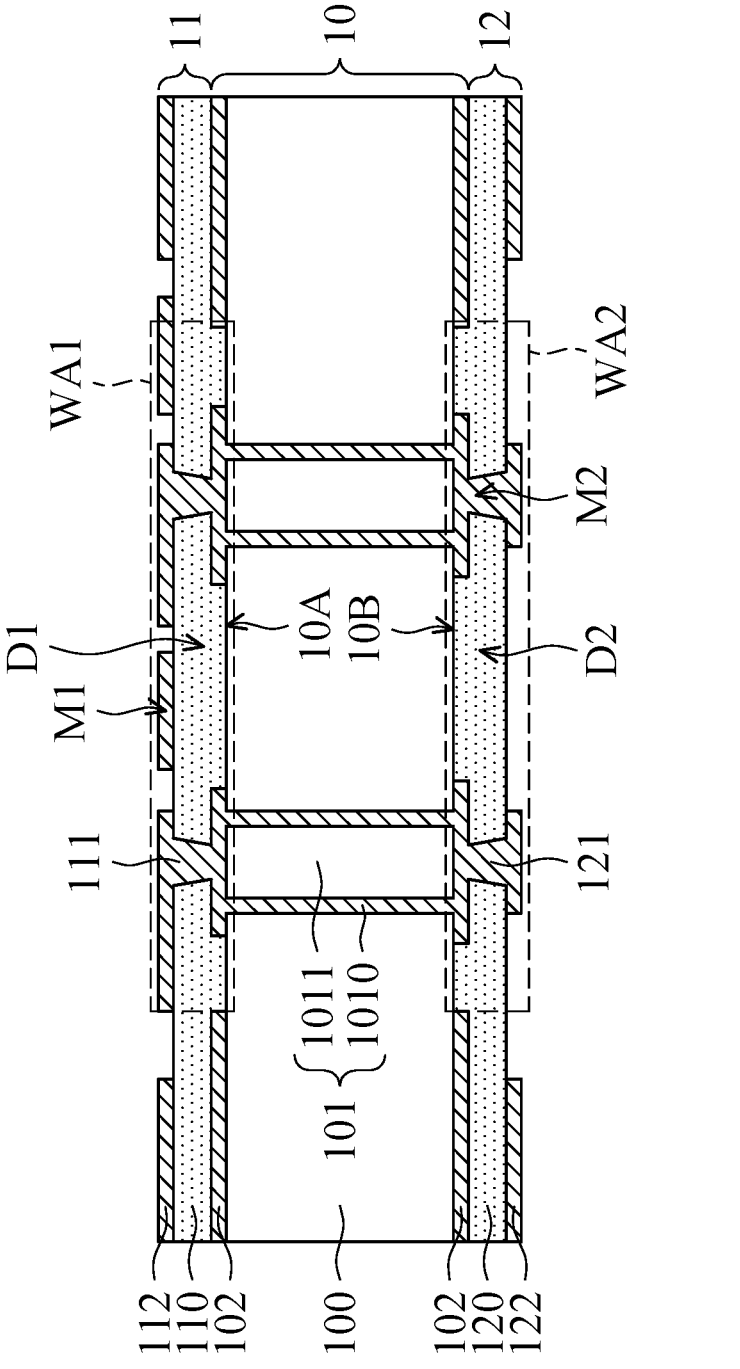
FIGS. 1 to 4 are respectively schematic cross-sectional views showing different steps in the forming method of the wiring board structure according to some embodiments of the present disclosure.

The devices of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar or corresponding reference numerals may be used in different embodiments to designate similar or corresponding elements in order to clearly describe the present disclosure. However, the use of these similar or corresponding reference numerals is only for the purpose of simply and clearly description of some embodiments of the present disclosure, and does not imply any correlation between the different embodiments or structures discussed.

In addition, it should be understood that ordinal numbers such as "first", "second", and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as "connect", "interconnect", "bond", and the like, unless otherwise defined, may refer to two structures in direct contact, or may also refer to two structures not in direct contact, that is there is another structure disposed between the two structures. Moreover, the terms related to bonding and connection can also include embodiments in which both structures are movable, or both structures are fixed. Furthermore, the terms "electrically connected" or "electrically coupled" include any direct and indirect means of electrical connection.

Herein, the terms "approximately", "about", and "substantially" generally mean within 10%, within 5%, within 3%, within 2%, within 1%, or within 0.5% of a given value or range. The given value is an approximate value, that is, "approximately", "about", and "substantially" can still be implied without the specific description of "approximately", "about", and "substantially". The phrase "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 0.5% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be understood that, in the following embodiments, features in several different embodiments may be replaced, recombined, and bonded to complete other embodiments without departing from the spirit of the present disclosure. The features of the various embodiments can be used in any combination as long as they do not violate the spirit of the present disclosure or conflict with each other.

Unless otherwise defined, all terms (including technical and scientific terms) used herein have the same meaning as commonly understood by a person of ordinary skills in the art. It is understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

In some implementations of wiring board structure, in order to meet high-frequency and high-speed electrical requirements, special circuit layout is required to comply with signal integrity and impedance control. In this case, the expected differential may be met by setting up a cooper-free area. It should be noted that the "cooper-free area" used in the present disclosure refers to the low number of conductive connectors in this area (for example, only vertical connectors are provided, but no horizontal connectors are provided), resulting in the content of metal conductors (e.g., copper or its alloys) in this area is low compared to other areas of the wiring board structure. Therefore, in some embodiments, this configuration may also be called a "cooper-free structure in a vertical direction".

However, although the setting of the cooper-free area solves the electrical requirements, it also brings mechanical problems. Since the total amount of metal conductors (e.g., copper or its alloys) in the cooper-free area is lower than in other areas of the wiring board structure, it may cause stress concentration problems in the wiring board structure. For example, when the wiring board structure is at operating temperatures (e.g., above $200°$ C.), the strength (e.g., Young's modulus) of the cooper-free areas will be lower than other areas of the wiring board structure, resulting in the circuit board structure warping with the copper-free area as the axis.

In order to solve the above technical problems, the present disclosure provides a wiring board structure that avoids the warping problem of the wiring board structure at operating temperature by replacing the dielectric material in the cooper-free area with a high-strength material. Furthermore, the present disclosure may more effectively control manufacturing costs and product quality by adjusting the arrangement of high-strength materials.

FIGS. 1 to 4 are respectively schematic cross-sectional views showing the different steps in the forming method of the wiring board structure according to some embodiments of the present disclosure. It should be understood that, for clarity of explanation, some components of the wiring board structure are omitted in the drawings, and only some components are schematically illustrated. In some embodiments, additional components may be added to the package carrier described below. In other embodiments, some components of the wiring board structure described below may be replaced or omitted. It should be understood that in some embodiments, additional operational steps may be provided before, during, and/or after the forming method of the wiring board structure. In some embodiments, some of the steps described may be replaced or omitted, and the order of some of the steps described is interchangeable.

As shown in FIG. 1, in some embodiments, the substrate 10 is provided and has the first side 10A and the second side 10B opposite to each other. For example, the substrate 10 may be or include a copper foil substrate, but the present disclosure is not limited thereto. In some embodiments, the substrate 10 may include the core layer 100, the vertical connectors 101, and the horizontal connectors 102, but the present disclosure is not limited thereto.

In some embodiments, the core layer 100 may be used to support other components disposed thereon, such as the first build-up circuit layer 11, the second build-up circuit layer 12, etc. described hereinafter. In some embodiments, the core layer 100 may be or may include a prepreg containing polymer materials, fiber materials, or other suitable materials, but the present disclosure is not limited thereto. For example, the polymer material may be or include epoxy resin, polyimide (PI), other suitable polymer materials, or combinations thereof, but the present disclosure is not limited thereto. For example, the fiber material may include carbon fiber, glass fiber, other suitable fiber materials, or combinations thereof, but the present disclosure is not limited thereto.

In some embodiments, the vertical connector 101 is disposed in the core layer 100 and penetrates through the core layer 100, and the vertical connector 101 may be used to electrically connect various electronic components located on both sides of the core layer 100. For example, a through hole may be formed on the core layer 100 through a drilling process, and plating, etching, other suitable processes, or combinations thereof may be performed on the through hole to form the vertical connector 101, but the present disclosure is not limited thereto. In some embodiments, the drilling process may be or may include laser drilling, mechanical drilling, other suitable drilling processes, or combinations thereof, but the present disclosure is not limited thereto. In some embodiments, the etching process may be or may include dry etching (e.g., reactive-ion etching (RIE)), wet etching, other suitable etching methods, or combinations thereof, but the present disclosure is not limited thereto. In some embodiments, the plating process may be or include electroplating, electroless plating, other suitable plating processes, or combinations thereof, but the present disclosure is not limited thereto. In some embodiments, after the through holes are formed, a seed layer may also be formed in the through hole by performing a chemical vapor deposition (CVD) process, physical vapor deposition (PVD) process, other suitable deposition processes, or combinations thereof, and then the vertical connector 101 is formed by performing plating, etching, other suitable processes, or combinations thereof.

In some embodiments, the vertical connector 101 may include the first conductive layer 1010 and the first filling layer 1011. In some embodiments, the first conductive layer 1010 may be or may include a conductive material. For example, the conductive material may be aluminum (Al), copper (Cu), alloys or compounds thereof, but the present disclosure is not limited thereto. For example, the copper alloy or compound may be or include brass, phosphor bronze, beryllium copper, or oxygen-free copper, but the present disclosure is not limited thereto. In some embodiments, the first filling layer 1011 may be or may include epoxy resin, polyimide (PI), build-up film material (Ajinomoto build-up film, ABF), other suitable polymer materials, or combinations thereof, but the present disclosure is not limited thereto.

In some embodiments, the horizontal connectors 102 are disposed on both sides of the core layer 100, and the horizontal connectors 102 may be used to electrically connect various electronic components located on the same side of the core layer 100. For example, a conductive material may be disposed on the core layer 100 and patterned through a photolithography process and an etching process to form the horizontal connector 102. In some embodiments, the photolithography process may include photoresist coating (e.g., spin-on coating), soft baking, mask aligning, exposure, post-exposure baking, photoresist developing, rinsing, drying (for example, spin-drying and/or hard baking), other suitable photolithography techniques and/or combinations thereof. In some embodiments, the vertical connector 101 and the horizontal connector 102 may be formed simultaneously in the same process, or the vertical connector 101 and the horizontal connector 102 may be formed in different processes.

In some embodiments, the horizontal connector 102 may be or may include a conductive material. For example, the conductive material may be aluminum (Al), copper (Cu), alloys or compounds thereof, but the present disclosure is not limited thereto. In some embodiments, the material of the horizontal connector 102 may be similar or the same as that of vertical connector 101, but the present disclosure is not limited thereto.

As shown in FIG. 1, following the above process, in some embodiments, the first build-up circuit layer 11 is disposed on the first side 10A of the substrate 10. In some embodiments, the first build-up circuit layer 11 may include the first dielectric layer 110, the first vertical connector 111, and the first horizontal connector 112.

In some embodiments, the first dielectric layer 110 may be used to support other components disposed on or in it, such as the first vertical connector 111 and the first horizontal connector 112. For example, the first dielectric layer 110 (and the conductive material thereon) may be laminated on the substrate 10 through a lamination process, other suitable processes, or combinations thereof, but the present disclosure is not limited thereto. In some embodiments, the first dielectric layer 110 may include a plurality of sub-layers, and similar or identical processes or materials may be used to form each sub-layer. In some embodiments, the first dielectric layer 110 may be or may include epoxy resin, polyimide (PI), build-up film material (ABF), other suitable polymer materials, or combinations thereof, but the present disclosure is not limited thereto. In some embodiments, the material of the first dielectric layer 110 may be similar or the same as that of core layer 100, but the present disclosure is not limited thereto.

In some embodiments, the first vertical connector 111 is disposed in the first dielectric layer 110, and the first vertical connector 111 may be used to electrically connect various electronic components located on both sides of the first dielectric layer 110 or various electronic components in the first dielectric layer 110. For example, a through hole may be formed on the first dielectric layer 110 through a drilling process, and plating, etching, other suitable processes, or combinations thereof may be performed on the through hole to form the first vertical connector 111, but the present disclosure is not limited thereto. In some embodiments, the first vertical connector 111 may include a plurality of sub-vertical connectors, and similar or identical processes or materials may be used to form each sub-vertical connector.

In embodiments where the first dielectric layer 110 has a plurality of sub-layers, the sub-vertical connectors may be used to connect elements located on different sub-layers.

In some embodiments, the first vertical connector 111 may be or may include a conductive material. For example, the conductive material may be aluminum (Al), copper (Cu), alloys or compounds thereof, but the present disclosure is not limited thereto. In some embodiments, the material of the first vertical connector 111 may be similar or the same as that of vertical connector 101, but the present disclosure is not limited thereto.

In some embodiments, the first horizontal connector 112 is disposed in the first dielectric layer 110 or on the surface of the first dielectric layer 110 away from the core layer 100, and the first horizontal connector 112 may be used to electrically connect various electronic components on the same side (or at the same level) of the first dielectric layer 110. For example, a conductive material may be disposed on the first dielectric layer 110 and patterned through a photolithography process and an etching process to form the first horizontal connector 112. In some embodiments, the first vertical connector 111 and the first horizontal connector 112 may be formed simultaneously in the same process, or the first vertical connector 111 and the first horizontal connector 112 may be formed in different processes. In some embodiments, the first horizontal connector 112 may include a plurality of sub-horizontal connectors, and similar or identical processes or materials may be used to form each sub-horizontal connector. The sub-horizontal connectors described above may be used to connect elements on a single sub-layer.

In some embodiments, the first horizontal connection 112 may be or may include a conductive material. For example, the conductive material may be aluminum (Al), copper (Cu), alloys or compounds thereof, but the present disclosure is not limited thereto. In some embodiments, the material of the first horizontal connector 112 may be similar or the same as that of horizontal connector 102, but the present disclosure is not limited thereto.

As shown in FIG. 1, the first wiring area WA1 may be defined in the first build-up circuit layer 11. In some embodiments, the first wiring area WA1 may have the first metal M1 and the first dielectric D1, wherein the first dielectric D1 surrounds the first metal M1 and is in direct contact with the first metal M1.

In the present disclosure, the "first metal M1" may refer to the vertical connectors and the horizontal connectors in the first wiring area WA1, such as the first vertical connectors 111 and the first horizontal connectors 112, but the present disclosure is not limited thereto. For example, in some embodiments, the vertical connectors or horizontal connectors in the first wiring area WA1 may include metal parts and dielectric parts. In this case, the "first metal M1" may refer to the metal parts of the vertical connector or the horizontal connector in the first wiring area WA1. In some embodiments, the first metal M1 may form a plurality of vertical connectors and horizontal connectors, such as the first vertical connector 111 and the first horizontal connector 112 mentioned above.

In the present disclosure, the "first dielectric D1" may refer to a dielectric layer in the first wiring area WA1, such as the first dielectric layer 110, but the present disclosure is not limited thereto. Specifically, in order to simplify the process complexity and reduce production costs, one dielectric or multiple dielectrics with similar properties may be used to form the first dielectric layer 110, wherein this or these dielectrics may be called "first dielectric substance D1". In some embodiments, the first dielectric D1 may constitute a plurality of sub-layers of the first dielectric layer 110, and these sub-layers may be in direct contact or indirect contact with each other. In some embodiments, the material of the first dielectric D1 is the same as that of the core layer 100, but the present disclosure is not limited thereto. In some embodiments, the strength of the first dielectric D1 is less than the strength of the first metal M1, and the definition of strength will be further described below.

As shown in FIG. 1, following the above process, in some embodiments, the second build-up circuit layer 12 is disposed on the second side 10B of the substrate 10. In some embodiments, the second build-up circuit layer 12 may include the second dielectric layer 120, the second vertical connector 121, and the second horizontal connector 122.

In some embodiments, the second dielectric layer 120 may be used to support other components disposed on or in it, such as the second vertical connector 121 and the second horizontal connector 122. For example, the second dielectric layer 120 (and the conductive material thereon) may be laminated on the substrate 10 through a lamination process, other suitable processes, or combinations thereof, but the present disclosure is not limited thereto. In some embodiments, the second dielectric layer 120 may include a plurality of sub-layers, and similar or identical processes or materials may be used to form each sub-layer. In some embodiments, the second dielectric layer 120 may be or may include epoxy resin, polyimide (PI), build-up film material (ABF), other suitable polymer materials, or combinations thereof, but the present disclosure is not limited thereto. In some embodiments, the material of the second dielectric layer 120 may be similar or the same as that of first dielectric layer 110, but the present disclosure is not limited thereto.

In some embodiments, the second vertical connector 121 is disposed in the second dielectric layer 120, and the second vertical connector 121 may be used to electrically connect various electronic components located on both sides of the second dielectric layer 120 or various electronic components in the second dielectric layer 120. For example, a through hole may be formed on the second dielectric layer 120 through a drilling process, and plating, etching, other suitable processes, or combinations thereof may be performed on the through hole to form the second vertical connector 121, but the present disclosure is not limited thereto. In some embodiments, the second vertical connector 121 may include a plurality of sub-vertical connectors, and similar or identical processes or materials may be used to form each sub-vertical connector. In embodiments where the second dielectric layer 120 has a plurality of sub-layers, the sub-vertical connectors may be used to connect elements located on different sub-layers.

In some embodiments, the second vertical connector 121 may be or may include a conductive material. For example, the conductive material may be aluminum (Al), copper (Cu), alloys or compounds thereof, but the present disclosure is not limited thereto. In some embodiments, the material of the second vertical connector 121 may be similar or the same as that of first vertical connector 111, but the present disclosure is not limited thereto.

In some embodiments, the second horizontal connector 122 is disposed in the second dielectric layer 120 or on the surface of the second dielectric layer 120 away from the core layer 100, and the second horizontal connector 122 may be used to electrically connect various electronic components on the same side (or at the same level) of the second dielectric layers 120. For example, a conductive material may be disposed on the second dielectric layer 120 and patterned through a photolithography process and an etching process to form the second horizontal connector 122. In some embodiments, the second vertical connector 121 and the second horizontal connector 122 may be formed simultaneously in the same process, or the second vertical connector 121 and the second horizontal connector 122 may be formed in different processes. In some embodiments, the second horizontal connector 122 may include a plurality of sub-horizontal connectors, and similar or identical processes or materials may be used to form each sub-horizontal connector. The sub-horizontal connectors described above may be used to connect elements on a single sub-layer.

In some embodiments, the second horizontal connection 122 may be or may include a conductive material. For example, the conductive material may be aluminum (Al), copper (Cu), alloys or compounds thereof, but the present disclosure is not limited thereto. In some embodiments, the material of the second horizontal connector 122 may be similar or the same as that of first horizontal connector 112, but the present disclosure is not limited thereto.

As shown in FIG. 1, the second wiring area WA2 may be defined in the second build-up circuit layer 12, wherein the second wiring area WA2 and the first wiring area WA1 correspond to each other, and the volume of the second wiring area WA2 is the same as that of the first wiring area WA1. In the present disclosure, the second wiring area WA2 has a special circuit layout considering signal integrity and impedance control. Specifically, the second wiring area WA2 includes the second vertical connector 121 but does not include the second horizontal connector 122. For example, the edges of the second horizontal connector 122 or its sub-horizontal connectors may be used as boundaries, and the range of the second wiring area WA2 is defined by these boundaries. In other words, the horizontal connectors (e.g., the second horizontal connectors 122) of the second build-up circuit layer 12 are located outside the second wiring area WA2, and the vertical connectors (e.g., the second vertical connector 121) inside the second wiring area WA2 and the horizontal connector (for example, the second horizontal connector 122) outside the second wiring area WA2 are electrically isolated from each other.

In some embodiments, the second wiring area WA2 may have the second metal M2 and the second dielectric D2, wherein the second dielectric D2 surrounds the second metal M2 and is in direct contact with the second metal M2.

Herein, the "second metal M2" may refer to the vertical connector in the second wiring area WA2, such as the second vertical connector 121, but the present disclosure is not limited thereto. For example, in some embodiments, the vertical connectors in the second wiring area WA2 may include metal parts and dielectric parts. In this case, the "second metal M2" may refer to the metal parts of the vertical connector in the second wiring area WA2. In some embodiments, the second metal M2 may constitute a plurality of vertical connectors, and these vertical connectors are electrically isolated from each other. For example, the second metal M2 may form two second vertical connectors 121 as shown in FIG. 1, and the two second vertical connectors 121 are electrically isolated from each other. In some embodiments, the material of the second metal M2 is the same as that of the first metal M1, but the present disclosure is not limited thereto.

Figure 2:
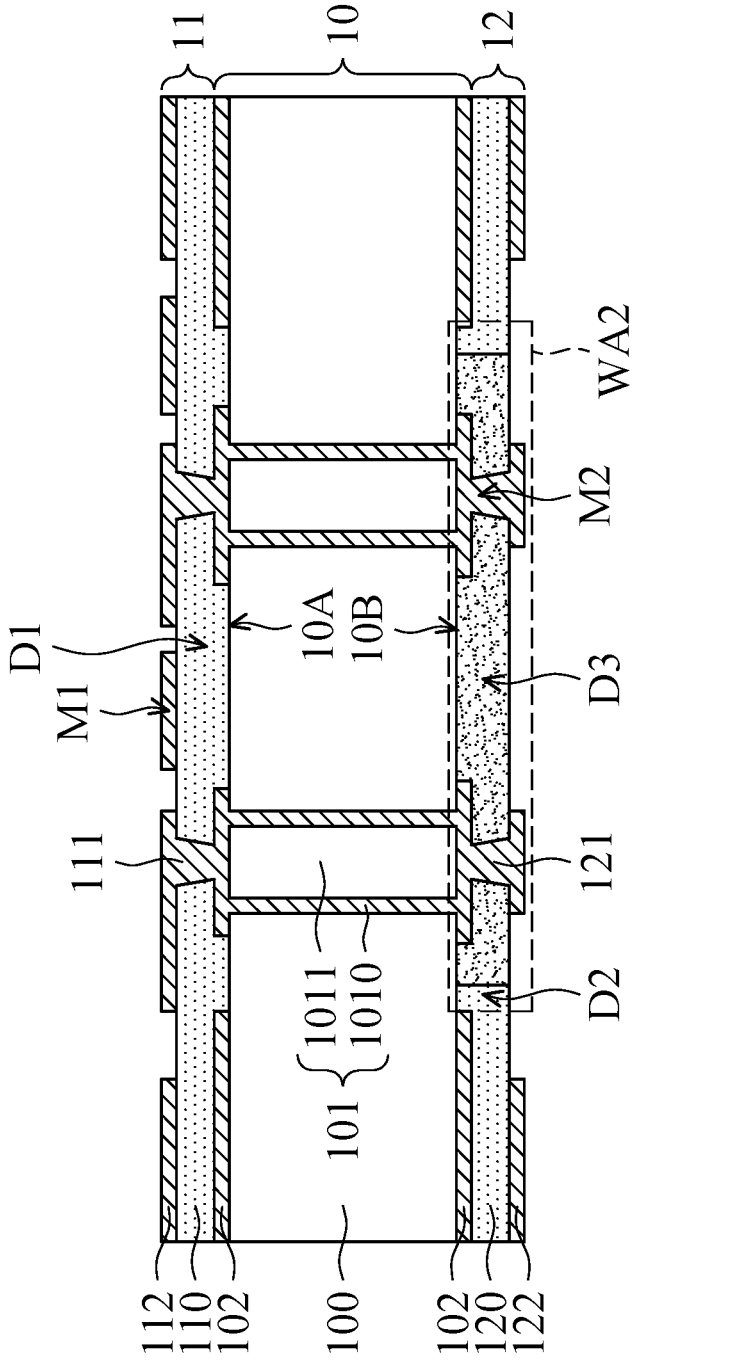

In the present disclosure, the "second dielectric D2" may refer to the dielectric layer in the second wiring area WA2, such as the entire second dielectric layer 120 (as shown in FIG. 1) or a part of the second dielectric layer 120 (as shown in FIG. 2). Specifically, in order to improve the strength of the second wiring area WA2, in subsequent processes, the dielectric layer in the second wiring area WA2 will have two different dielectrics (for example, with different mechanical properties), one of which is the "second dielectric D2", and the other is the "third dielectric D3". In some embodiments, the second dielectric D2 may constitute a plurality of sub-layers in the second dielectric layer 120, and these sub-layers may be in direct contact or indirect contact with each other. In some embodiments, the material of the second dielectric D2 is the same as that of the first dielectric D1, but the present disclosure is not limited thereto. In some embodiments, the strength of the second dielectric D2 is less than the strength of the first metal M1 and/or the second metal M2, and the definition of strength will be further described below.

Based on the above, if the design requirements are met, the first wiring area WA1 and the second wiring area WA2 have an asymmetric structure. Specifically, the second wiring area WA2 has vertical connectors but not horizontal connectors, while the first wiring area WA1 has both vertical connectors and horizontal connectors. In this case, the total volume of the second metal M2 in the second wiring area WA2 is less than the total volume of the first metal M1 in the first wiring area WA1. As a result, the strength of the first wiring area WA1 may be greater than the second wiring area WA2.

To this end, a part of the second dielectric D2 in the second wiring area WA2 may be removed, and this portion may be replaced with the third dielectric D3, wherein the third dielectric D3 has material that is different from that of the second dielectric D2. For example, after the step of disposing the second dielectric layer 120 on the substrate 10 and before the step of forming the second vertical connector 121 and the second horizontal connector 122, a part of the second dielectric D2 in the second wiring area WA2 of the second dielectric layer 120 may be removed to form a through hole, and the third dielectric D3 is filled into the through hole. Next, after the second wiring area WA2 of the second dielectric layer 120 includes the second dielectric D2 and the third dielectric D3, the second vertical connectors 121 and the second horizontal connector 122 are formed in the second dielectric layer 120. In this way, the second dielectric D2 may be replaced with the third dielectric D3, thereby obtaining the structure as shown in FIG. 2. However, the present disclosure is not limited to the above-mentioned methods or steps.

In some embodiments, the third dielectric D3 penetrates through the second dielectric layer 120 in the second build-up circuit layer 12 along the vertical direction (i.e., the normal direction of the substrate 10). In other words, the third dielectric D3 may be in a columnar shape, such as a cylinder, an elliptical cylinder, a rectangular cylinder, a triangular cylinder, or a polygonal cylinder. In some embodiments, in the cross-sectional view, the third dielectric D3 may be trapezoidal, funnel-shaped, pear-shaped, or other suitable shapes. In some embodiments, the bottom surface of the third dielectric D3 is coplanar with the bottom surface of the second dielectric D2, but the present disclosure is not limited thereto. In some embodiments, the top surface of the third dielectric D3 is coplanar with the top surface of the second dielectric D2, but the present disclosure is not limited thereto. By replacing a part of the second dielectric D2 in the second wiring area WA2 with the third dielectric D3, some problems that occurred from the asymmetry between the first wiring area WA1 and the second wiring area WA2 may be improved.

More specifically, the third dielectric D3 has higher strength (e.g., rigidity) than the second dielectric D2. It should be noted that the term "strength" used in the present disclosure refers to physical properties under specific conditions, such as physical properties at about 250° C. Since the operating temperature of the wiring board structure may be as high as 200° C. (for example, 250° C.), in order to avoid possible warping under this condition, the strength of the third dielectric D3 at 250° C. needs to be greater than the strength of the second dielectric D2 at 250° C. In some embodiments, since the rigidity of the third dielectric D3 is greater than the rigidity of the second dielectric material D2, the third dielectric D3 may also be called a high-rigidity material. In some embodiments, the strength of the third dielectric D3 is less than the strength of the first metal M1 and/or the second metal M2.

In some embodiments, rigidity may be expressed in terms of Young's modulus. Specifically, normal strain occurs when a material is subjected to normal stress. When the amount of strain does not exceed the upper elastic limit of the material, the ratio of normal stress to normal strain is defined as the Young's modulus of the material. Therefore, the higher the Young's modulus, the less likely the material is to deform. In some embodiments, the Young's modulus of the third dielectric D3 is greater than 1000 MPa at 250° C., but the present disclosure is not limited thereto. In some embodiments, the Young's modulus of the third dielectric D3 is between 1800 MPa and 2400 MPa at 250° C., but the present disclosure is not limited thereto. For example, the Young's modulus of the third dielectric D3 at 250° C. may be 1800 MPa, 1900 MPa, 2000 MPa, 2100 MPa, 2200 MPa, 2300 MPa, 2400 MPa, or any value or any range of values between the above values, but the present disclosure is not limited thereto. In some embodiments, the Young's modulus of the first dielectric D1 and the second dielectric D2 is less than 1000 MPa at 250° C., but the present disclosure is not limited thereto. In some embodiments, the Young's modulus of the first dielectric D1 and the second dielectric D2 is between 100 MPa and 500 MPa at 250° C., but the present disclosure is not limited thereto. For example, the Young's modulus of the first dielectric D1 and the second dielectric D2 at 250° C. may be 100 MPa, 150 MPa, 200 MPa, 250 MPa, 300 MPa, 400 MPa, 500 MPa, or any value or range of values between the above values, but the present disclosure is not limited thereto.

In other embodiments, rigidity may also be expressed in terms of the coefficient of thermal expansion (CTE). Before filling the third dielectric D3, the strength of the second wiring area WA2 may be lower than the strength of the first wiring area WA1, which causes both sides of the wiring board structure to exert compressive stress toward the second wiring area WA2 (compressive stress) and warping. Therefore, the second dielectric D2 may be replaced with the third dielectric D3 having a large thermal expansion coefficient, so that the second wiring area WA2 may expand outward to resist compressive stress at the operating temperature. In some embodiments, the thermal expansion coefficient of the third dielectric D3 is greater than 70 ppm/° C. at 250° C., but the present disclosure is not limited thereto. In some embodiments, the thermal expansion coefficient of the third dielectric D3 is between 75 ppm/° C. and 95 ppm/° C. at 250° C., but the present disclosure is not limited thereto. For example, the thermal expansion coefficient of the third dielectric D3 may be 75 ppm/° C., 77.5 ppm/° C., 80 ppm/° C., 82.5 ppm/° C., 85 ppm/° C., 90 ppm/° C., 95 ppm/° C., or any value or range of values between the above values at 250° C., but the present disclosure is not limited thereto. In some embodiments, the thermal expansion coefficients of the first dielectric D1 and the second dielectric D2 are less than 70 ppm/° C. at 250° C., but the present disclosure is not limited thereto. In some embodiments, the thermal expansion coefficients of the first dielectric D1 and the second dielectric D2 are between 40 ppm/° C. and 60 ppm/° C. at 250° C., but the present disclosure is not limited thereto. For example, the thermal expansion coefficients of the first dielectric material D1 and the second dielectric D2 may be 40 ppm/° C., 42.5 ppm/° C., 45 ppm/° C., 47.5 ppm/° C., 50 ppm/° C., 55 ppm/° C., 60 ppm/° C., or any value or range of values between the above values at 250° C., but the present disclosure is not limited thereto.

It should be noted that although Young's modulus and thermal expansion coefficient are used to define strength (or rigidity) above, but the present disclosure is not limited thereto. In other embodiments, yield strength, tensile strength, Poisson's ratio, other suitable physical properties, or combinations thereof may also be used to represent the strengths of the first dielectric D1, the second dielectric D2, and the third dielectric D3.

Figure 3:
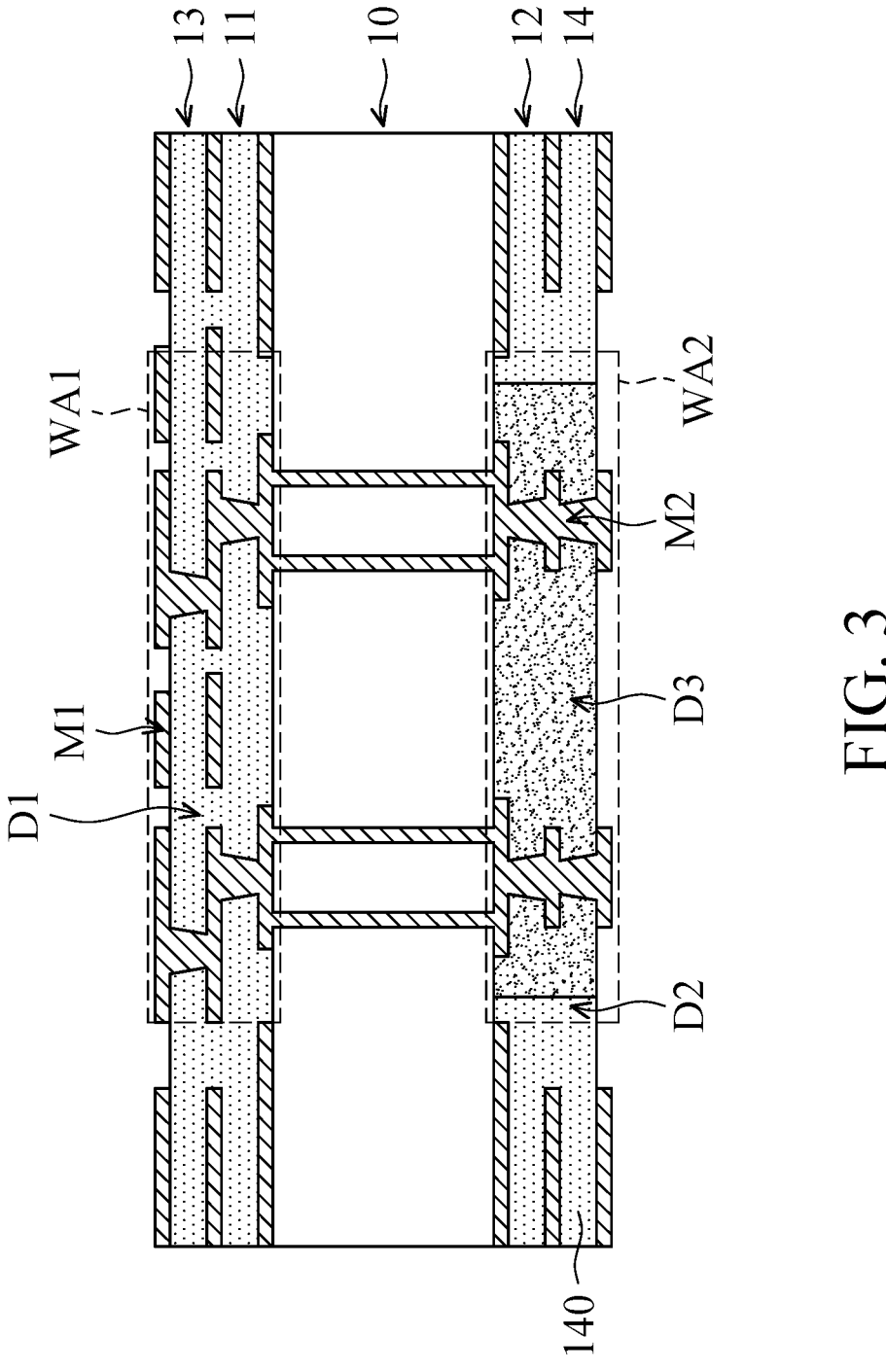

Optionally, in some embodiments, build-up circuit layers may be continued to be provided on both sides of the core layer 100 and steps similar to those described above may be performed to reduce the warping problem of the resulting wiring board structure. For example, as shown in FIG. 3, the first build-up circuit layer 13 may be provided on the first build-up circuit layer 11, and the second build-up circuit layer 14 may be provided on the second build-up circuit layer 12. After disposing additional build-up circuit layers, the first wiring area WA1 may be redefined in the first build-up circuit 11 and the first build-up circuit 13, wherein the first wiring area WA1 has vertical connectors and horizontal connectors. In addition, after disposing additional build-up circuit layers, the second wiring area WA2 may be redefined in the second build-up circuit 12 and the second build-up circuit 14, wherein the second wiring area WA2 has vertical connectors instead of horizontal connectors.

Figure 4:
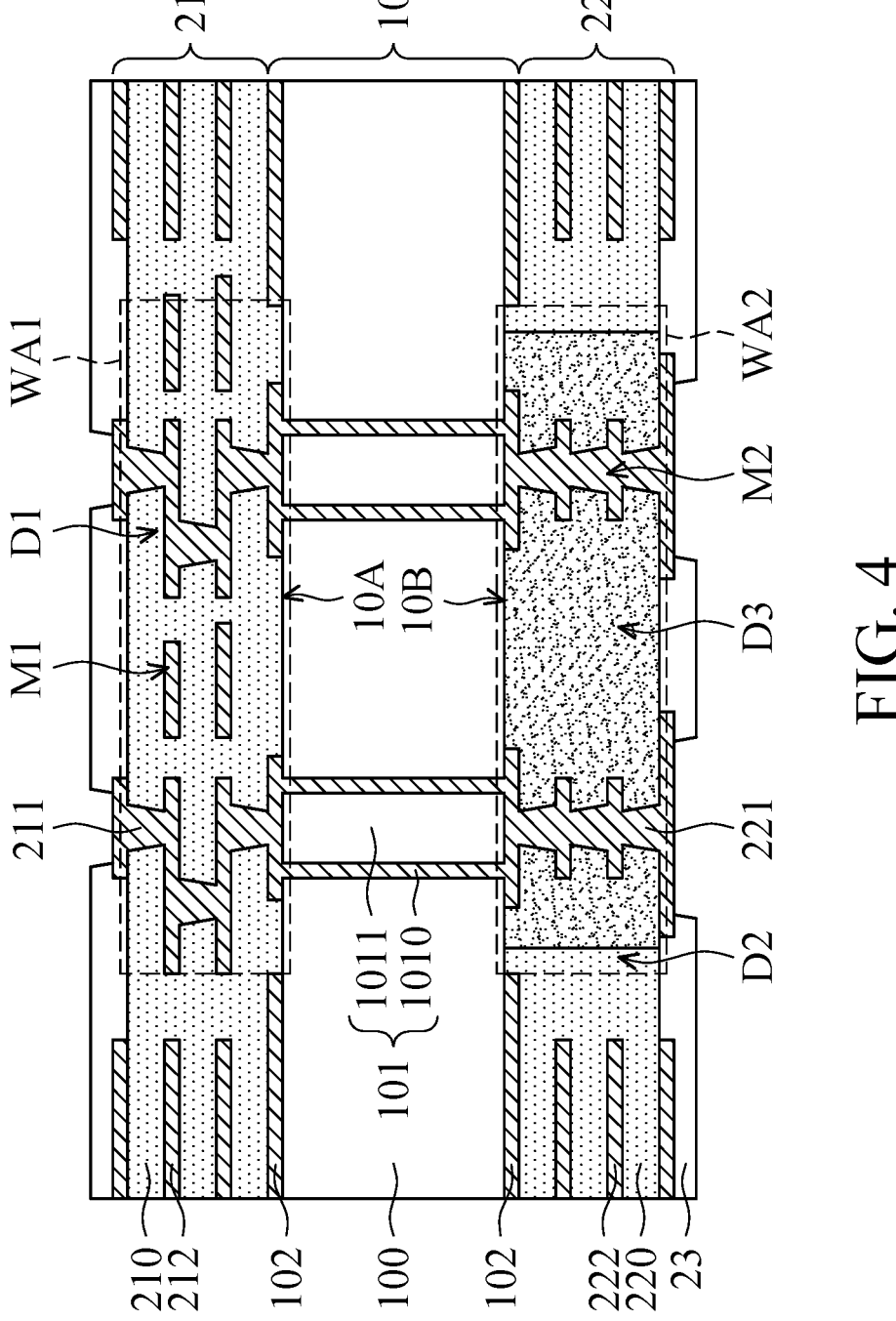

In some embodiments, the steps described above may be repeatedly performed until the number of layers and structure of the wiring board structure meet the design requirements. Taking FIG. 4 as an example, after three build-up circuit layers are respectively provided on both sides of the substrate 10, the structure as shown in FIG. 4 is formed (the protective layer 23 will be further described below), but the present disclosure is not limited to the number, thickness, proportions, or specific structure of the build-up circuit layers.

For the sake of simplicity, in the following, the build-up circuit layers located on the first side 10A are collectively referred to as the first build-up circuit layer 21, wherein the first build-up circuit layer 21 includes a plurality of build-up circuit layers (e.g., the first build-up circuit layer 11, the first build-up circuit layer 13, etc. shown in FIGS. 1 to 3), and the first build-up circuit layer 21 may include the first dielectric layer 210, the first vertical connector 211, and the first horizontal connector 212. In addition, the first build-up circuit layer 21 has the first wiring area WA1, and the first wiring area WA1 includes the first metal M1 and the first dielectric D1.

Likewise, for the sake of simplicity, in the following, the build-up circuit layers located on the second side 10B are collectively referred to as the second build-up circuit layer 22, wherein the second build-up circuit layer 22 includes a plurality of build-up circuit layers (e.g., the second build-up circuit layer 12, the second build-up circuit layer 14, etc.

shown in FIGS. 1 to 3), and the second build-up circuit layer 22 may include the second dielectric layer 220, the second vertical connector 221, and the second horizontal connector 222. In addition, the second build-up circuit layer 22 has the second wiring area WA2, and the second wiring area WA2 includes the second metal M2, the second dielectric D2, and the third dielectric D3.

In some embodiments, the ratio of the total volume of the third dielectric D3 to the total volume of the second dielectric D2 in the second wiring area WA2 is between 0.45 and 0.55. In other words, approximately half (for example, approximately 50%) of the second dielectric D2 in the second wiring area WA2 may be removed in the above various removal processes, and the removed part may be replaced with the third dielectric D3. It should be noted that, compared with replacing all the second dielectric material D2 in the second wiring area WA2 with the third dielectric D3, replacing a part of (for example, 50%) the second dielectric material D2 in the second wiring area WA2 with the third dielectric D3 may further reduce production costs while effectively improving structural strength.

As shown in FIG. 4, following the above process, the protective layer 23 is disposed on the first build-up circuit layer 21 and the second build-up circuit layer 22 to form the wiring board structure 1. In some embodiments, the protective layer 23 may be provided by dip coating, roller coating, curtain coating, spraying, screen printing, other suitable processes, or combinations thereof, but the present disclosure is not limited thereto. In some embodiments, the material of the protective layer 23 may be or include resin or other suitable materials, but the present disclosure is not limited thereto. For example, the protective layer 23 may be solder resist ink.

Figure 5:
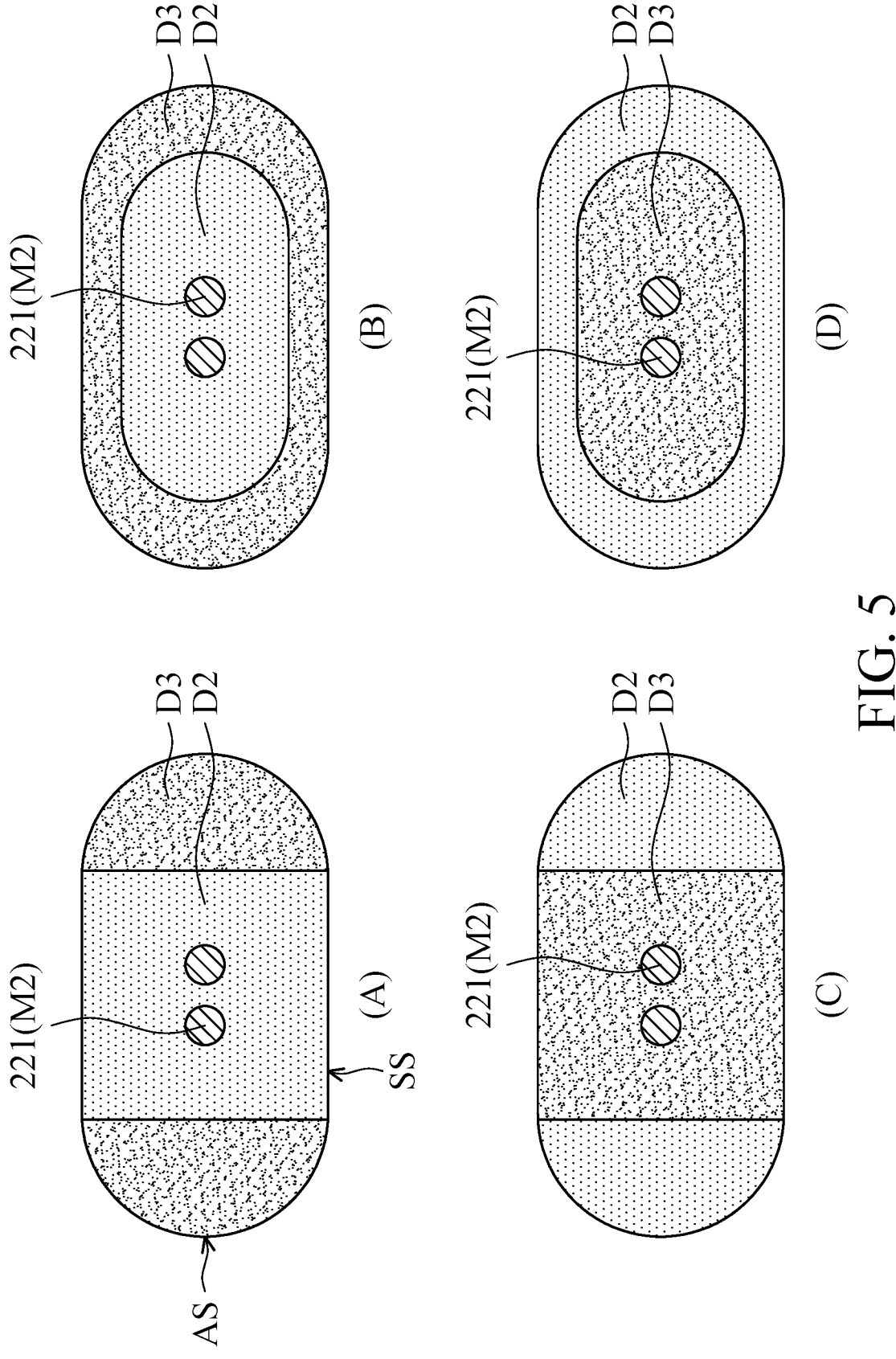
FIG. 5 is a schematic top view showing the different wiring board structures according to some embodiments of the present disclosure.
Figure 6:
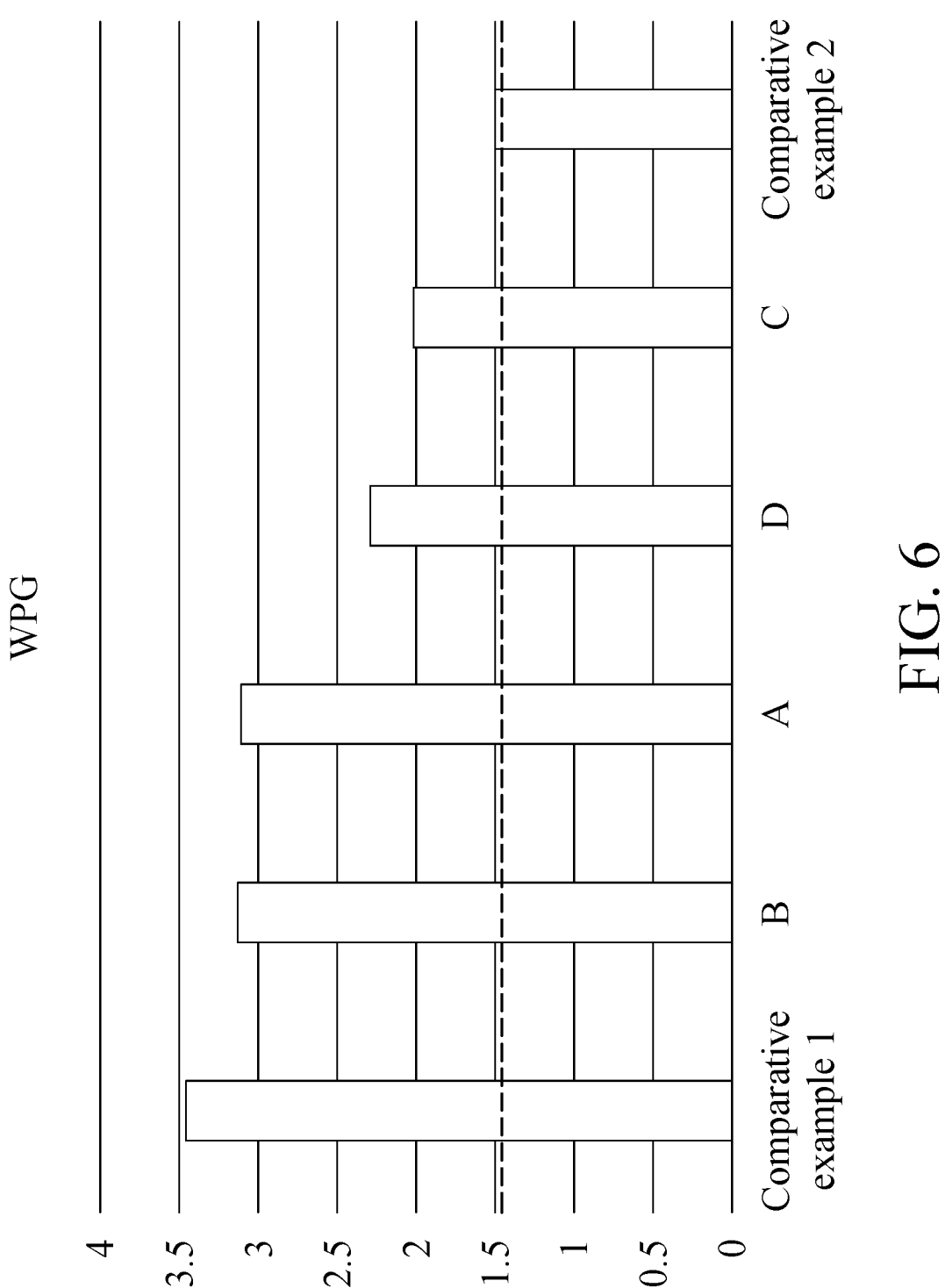
FIG. 6 is a schematic diagram showing the degree of warpage of the wiring board structure according to some embodiments of the present disclosure.

FIGS. 5 and 6 are respectively schematic diagrams showing the different top views of the wiring board structure and the degree of warpage of the wiring board structure according to some embodiments of the present disclosure. It should be noted that, for the sake of simplicity, aspects (A) to (D) in FIG. 5 only show the second dielectric D2, the third dielectric D3, and the second metal M2 in the second wiring area WA2, and other elements are omitted. In addition, in some embodiments, FIG. 5 may be called a schematic bottom view of the wiring board structure. That is, aspects (A) to (D) of FIG. 5 may be observed from the bottom of the wiring board structure of FIG. 4.

As shown in aspects (A) to (D) of FIG. 5, in some embodiments, in a top view, the second wiring area WA2 has two opposite straight sides SS and two opposite arcs sides AS, and the two second vertical connectors 221 are disposed therein, but the present disclosure is not limited thereto. In other embodiments, the second wiring area WA2 may also have other shapes, such as a circle, an ellipse, a rectangle, a triangle, a polygon, a trapezoid, or other suitable shapes. Alternatively, in other embodiments, the second wiring area WA2 may also have one second vertical connector 221 or more than two second vertical connectors 221, such as four, five, or more second vertical connectors 221.

In aspect (A), the third dielectric D3 is separated from the second metal M2 by the second dielectric D2. In other words, the third dielectric D3 is not contact with the second metal M2. In some embodiments, the second dielectric D2 has a rectangular shape in a top view, but the present disclosure is not limited thereto. In other embodiments, in a top view, the second dielectric D2 may also have other shapes, such as a circle, an ellipse, a rectangle, a triangle, a polygon, a trapezoid, or other suitable shapes.

In aspect (B), the third dielectric D3 is separated from the second metal M2 by the second dielectric D2, and the third dielectric D3 surrounds the second dielectric D2. In some embodiments, the second dielectric D2 has a shape similar to the second wiring area WA2 in a top view. That is, the second dielectric D2 has two opposite straight sides and two opposite arc sides, but the present disclosure is not limited thereto.

In aspect (C), the second dielectric D2 is separated from the second metal M2 by the third dielectric D3. In other words, the second dielectric D2 is not contact with the second metal M2. In some embodiments, the third dielectric D3 has a rectangular shape in a top view, but the present disclosure is not limited thereto. In other embodiments, in a top view, the third dielectric D3 may also have other shapes, such as a circle, an ellipse, a rectangle, a triangle, a polygon, a trapezoid, or other suitable shapes.

In aspect (D), the second dielectric D2 is separated from the second metal M2 by the third dielectric D3, and the second dielectric D2 surrounds the third dielectric D3. In some embodiments, in a top view, the third dielectric D3 has a shape similar to the second wiring area WA2. That is, the third dielectric D3 has two opposite straight sides and two opposite arc sides, but the present disclosure is not limited thereto.

As shown in FIG. 6, in some embodiments, a detection equipment may be used to detect the warpage and deformation of the wiring board structure in the above application examples based on the principle of optical interference. In the present disclosure, the wiring board structure may be heated from normal temperature (for example, 25° C.) to the operating temperature (for example, 260° C.), and then the wiring board structure may be cooled back to normal temperature (for example, 25° C.) to measure the degree of warpage WPG. In the figure, the degree of warpage WPG is the deflection of the wiring board structure after bending, which may be expressed in micrometers (μm). Compared with the second dielectric layer 120 in the second wiring area WA2, which is entirely composed of the second dielectric D2 (Comparative Example 1), the second dielectric D2 partially replaced with the third dielectric D3 may effectively reduce warpage. For example, aspects (A) to (D) may reduce the warpage degree from 3.5 μm to 3 μm, 3 μm, 2.25 μm, and 2 μm respectively. On the other hand, compared to the second dielectric layer 120 in the second wiring area WA2, which is entirely composed of the third dielectric D3 (Comparative Example 2), the second dielectric D2 partially replaced with the third dielectric D3 may effectively reduce production costs without significantly increasing the degree of warpage WPG. For example, the warpage amount of aspect (C) (approximately 2 μm) is close to that of comparative example 2 (approximately 1.5 μm), but only about half of the third dielectric D3 is used.

In summary, the present disclosure provides a wiring board structure that prevents the wiring board structure from warping by disposing different dielectrics in specific areas. In addition, the present disclosure further reduces production costs by allowing different dielectric materials to have specific shapes and proportions.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A wiring board structure, comprising:
a substrate having a first side and a second side opposite to each other;
a first build-up circuit layer disposed on the first side of the substrate, wherein the first build-up circuit layer has a first wiring area, and the first wiring area comprises:
a first metal;
a first dielectric; and
a second build-up circuit layer disposed on the second side of the substrate, wherein the second build-up circuit layer has a second wiring area, and the second wiring area comprises:
a second metal, wherein a total volume of the second metal is less than a total volume of the first metal;
a second dielectric; and
a third dielectric, wherein a material of the third dielectric is different from a material of the second dielectric, and a ratio of a total volume of the third dielectric to a total volume of the second dielectric is between 0.45 and 0.55,
wherein a top surface and a bottom surface of the third dielectric are coplanar with a top surface and a bottom surface of the second dielectric, respectively.

2. The wiring board structure as claimed in claim 1, wherein the first wiring area and the second wiring area correspond to each other, and a volume of the first wiring area is the same as a volume of the second wiring area.

3. The wiring board structure as claimed in claim 1, wherein in a top view, the second wiring area has two opposite straight sides and two opposite arc sides.

4. The wiring board structure as claimed in claim 3, wherein in the top view, the third dielectric surrounds the second metal and is in direct contact with the second metal.

5. The wiring board structure as claimed in claim 4, wherein in the top view, the second dielectric is separated from the first second metal by the third dielectric.

6. The wiring board structure as claimed in claim 5, wherein in the top view, the third dielectric has a rectangular shape.

7. The wiring board structure as claimed in claim 5, wherein in the top view, the second dielectric surrounds the third dielectric.

8. The wiring board structure as claimed in claim 3, wherein in the top view, the third dielectric is separated from the second metal by the second dielectric.

9. The wiring board structure as claimed in claim 8, wherein in the top view, the second dielectric has a rectangular shape.

10. The wiring board structure as claimed in claim 1, wherein the third dielectric penetrates the second build-up circuit layer along a vertical direction.

11. The wiring board structure as claimed in claim 1, wherein a Young's modulus of the third dielectric material is greater than 1000 MPa at 250° C.

12. The wiring board structure as claimed in claim 11, wherein the Young's modulus of the third dielectric is between 1800 MPa and 2400 MPa at 250° C.

13. The wiring board structure as claimed in claim 1, wherein a thermal expansion coefficient of the third dielectric is greater than 70 ppm/° C. at 250° C.

14. The wiring board structure as claimed in claim 13, wherein the thermal expansion coefficient of the third dielectric is between 75 ppm/° C. and 95 ppm/° C. at 250° C.

15. The wiring board structure as claimed in claim 1, wherein a material of the first dielectric is the same as a material of the second dielectric.

16. The wiring board structure as claimed in claim 1, wherein a Young's modulus of the first dielectric and the second dielectric is between 100 MPa and 500 MPa at 250° C.

17. The wiring board structure as claimed in claim 1, wherein thermal expansion coefficients of the first dielectric and the second dielectric are between 40 ppm/° C. and 60 ppm/° C. at 250° C.

18. The wiring board structure as claimed in claim 1, wherein a material of the first metal is the same as a material of the second metal.

19. The wiring board structure as claimed in claim 1, wherein the second metal forms a plurality of vertical connectors, and the plurality of vertical connectors are electrically isolated from each other.

20. The wiring board structure as claimed in claim 19, wherein the second build-up circuit layer further comprises a horizontal connector, and the horizontal connector is located outside the second wiring area, wherein the plurality of vertical connectors in the second wiring area are electrically isolated from the horizontal connector.

* * * * *